(12) United States Patent
Yasuda et al.

(10) Patent No.: US 6,756,635 B2
(45) Date of Patent: Jun. 29, 2004

(54) SEMICONDUCTOR SUBSTRATE INCLUDING MULTIPLE NITRIDED GATE INSULATING FILMS

(75) Inventors: Yuri Yasuda, Tokyo (JP); Naohiko Kimizuka, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/166,189

(22) Filed: Jun. 10, 2002

(65) Prior Publication Data

US 2002/0185693 A1 Dec. 12, 2002

(30) Foreign Application Priority Data

Jun. 12, 2001 (JP) ........................................ 2001-177095

(51) Int. Cl.[7] .............................................. H01L 29/792
(52) U.S. Cl. ........................ 257/325; 257/411; 257/637; 257/638; 257/639
(58) Field of Search ................................. 257/288, 324, 257/325, 368, 390–392, 410, 411, 637–639; 438/216, 261, 287, 591, 954, 981

(56) References Cited

U.S. PATENT DOCUMENTS

| 5,969,397 | A | * | 10/1999 | Grider et al. | ................ 257/410 |
| 6,087,236 | A | * | 7/2000 | Chau et al. | ................. 438/301 |
| 6,417,051 | B1 | * | 7/2002 | Takebuchi | .................. 438/287 |

FOREIGN PATENT DOCUMENTS

JP  06-140392  5/1994

* cited by examiner

Primary Examiner—Long Pham
Assistant Examiner—Marcos D. Pizarro-Crespo
(74) Attorney, Agent, or Firm—Katten Muchin Zavis Rosenman

(57) ABSTRACT

A silicon oxide film with a film thickness of 5 to 7 nm is formed on a first region, a silicon oxynitride film with a film thickness of 2 to 3 nm, and a nitrogen concentration of 1 to 3 atom % is formed on a second region, and a silicon oxynitride film with a film thickness of 1 to 2 nm, and a nitrogen concentration of 3 to 5 atom % is formed on a third region on a silicon substrate. Then, radical nitriding is applied to the silicon oxide film, and the silicon oxynitride films.

3 Claims, 8 Drawing Sheets

SEMICONDUCTOR SUBSTRATE INCLUDING MULTIPLE NITRIDED GATE INSULATING FILMS

BACKGROUND OF THE INVENTION

1. Field of the Invention

The present invention relates to a semiconductor device including a plurality of types of transistors different in required characteristics, and a method for manufacturing this semiconductor device, and in particular, it relates to a semiconductor device having a plurality of types of gate dielectric films different in film thickness and nitrogen concentration, and a method for efficiently manufacturing this semiconductor device.

2. Description of the Related Art

A few types of transistors are selectively produced according to required performance in a semiconductor device. When a gate dielectric film of a transistor is made thin, an on-current of the transistor increases, and high speed performance increases. However, when the gate dielectric film is thin, a tunnel current flows between a gate electrode and a substrate, a gate leak current increases, and a power consumption of the transistor increases. To the contrary, when the gate dielectric film is made thick, though the gate leak current decreases, the on-current decreases, and the high speed performance decreases. Thus, when the high speed performance is required for a transistor, its gate dielectric film is manufactured as thin. When it is necessary to reduce the power consumption of a transistor by restraining the gate leak current, its gate dielectric film is manufactured as thick. A silicon oxide or oxynitride film is generally used as the gate dielectric film.

A high performance transistor (an HP transistor) is used in a core unit of a conventional semiconductor device. The core unit is a part where a circuit for executing high speed arithmetic and logic processing is provided. The film thickness and a threshold voltage of the gate dielectric film of the HP transistor are set to lower than those of transistors provided in other parts. The HP transistor has a structure for giving priority to securing the on-current which determines the high speed capability of the transistor over restraining the gate leak current which increases as the film thickness of the gate dielectric film becomes lower, and restraining the off-current which increases as the threshold voltage decreases. The off-current is also referred to as a sub-threshold current in general, and is a leak current which flows between the source and the drain when the gate electric potential and the source electric potential is equal in a transistor, namely when the transistor is tuned off.

A transistor (an I/O transistor), whose gate withstand voltage is prioritized, is used in an I/O unit. The I/O unit is a part where a circuit for providing data for and receiving data from other semiconductor devices is provided. The film thickness of the gate dielectric film of the I/O transistor is set to be higher than that of the transistor in other parts, and its threshold voltage is set to be higher than that of the transistors in the core.

A lower power transistor (an LP transistor) is used in a low power unit. The low power unit is a part where a circuit whose leak current is restrained as low as possible is provided to control power consumption in a standby state. The film thickness of the gate dielectric film of the LP transistor is set to a value between the film thickness of the gate dielectric film in the core unit, and the film thickness of the gate dielectric film in the I/O unit. With this constitution, the gate leak current is restrained.

Further, a middle performance transistor (an MP transistor) whose characteristics are between those of the HP transistor and the LP transistor is formed on the same chip in some cases. Generally, the film thickness of the gate dielectric film of the MP transistor is set to equal to the film thickness of the gate dielectric film of the HP transistor. The off-current of the MP transistor is set to be lower than the one of the HP transistor by setting the threshold voltage thereof. The MP transistor is used in a core unit of a conventional semiconductor device.

As described above, a common gate dielectric film is generally used both for the HP transistor and the MP transistor. And, the film thickness of the gate dielectric film of the LP transistor is set to be higher than the film thickness of the gate dielectric film of the HP (MP) transistor, the film thickness of the gate dielectric film of the I/O transistor is set to be higher than the film thickness of the gate dielectric film of the LP transistor. Namely, three types of transistors, which are the core transistor (the HP transistor and the MP transistor), the LP transistor, and the I/O transistor, are used for a semiconductor device. The off-current of the LP transistor is about 1 to 50 pA/$\mu$m, and the LP transistor is used for a circuit for which low power consumption is required. It is preferable to scale the gate dielectric film of the LP transistor, and to make it common with the gate dielectric film of the core transistor for simplifying a manufacturing step of the semiconductor device. However, when the gate dielectric films are made common, the gate leak current exceeds the off-current in a circuit where a low power consumption is prioritized, and the gate leak current determines the power consumption of the transistor. Because of the foregoing, the film thickness of the gate dielectric film of the LP transistor is not scaled, and is set to a film thickness different from that of the gate dielectric film of the core transistor (the HP transistor and the MP transistor). In this way, the film thicknesses of the gate dielectric films of the core transistor and the LP transistor are reduced almost to their limits in terms of the gate leak current.

A technique of introducing nitrogen (N) into the gate dielectric film that consists silicon oxide, and increasing the dielectric constant has been applied for simultaneously increasing the high speed performance and restraining the gate leak current of a transistor. Increasing the dielectric constant of the gate dielectric film allows decreasing an electrical film thickness of the gate dielectric film. As a result, the on-current of the transistor increases, and the speed of the transistor increases. Alternatively, the thickness of the gate dielectric film can be increased by an amount corresponding to the increase of the dielectric constant, and the gate leak current can be reduced.

As a method for introducing nitrogen into the gate dielectric film, heat treatment is applied to a silicon substrate in an NO atmosphere, for example. As another method, silane gas, $O_2$ gas, and $N_2$ gas are simultaneously supplied when the dielectric film is formed on the silicon substrate. Also, as another method, a silicon oxide film is annealed in an ammonia atmosphere. As yet another method, nitrogen is directly implanted into the silicon oxide film. However, the amount of nitrogen introduced into the silicon oxide film is about 2 to 3 atom %, and there is such a problem as the dielectric constant is not sufficiently increased in these methods.

Japanese Patent Publication Laid-Open No. Hei. 6-140392 discloses a method for radical-nitriding a silicon oxide film. With the method disclosed in Japanese Patent Publication Laid-Open No. Hei. 6-140392, a wafer on which a silicon oxide film is formed is loaded in a chamber, and is heated to 700 to 900° C. Then, $NH_3$ gas is introduced into the chamber, VUV plasma light emitting disc lamp is used to form Ar plasma, and nitrogen radical is generated. The generated nitrogen radical is used to directly nitride the silicon oxide film, and a silicon oxynitride film is formed. As a result, the silicon oxynitride film with a nitrogen concentration exceeding 10 atom % is formed. Nitrogen radical is nitrogen having one unpaired electron, and has larger energy and higher reactivity compared with non-radical nitrogen. Radical nitriding is also called as remote plasma nitriding.

However, the prior art has the following problems. Namely, when radical nitriding is simultaneously applied to a plurality of types of silicon oxide films having a film thickness different from one another, a larger amount of nitrogen is introduced into a silicon oxide film with a lower film thickness compared with a silicon oxide film with a higher film thickness.

Thus, in the thinnest silicon oxide film, the nitrogen reaches an interface between this silicon oxide film and the silicon substrate earliest. When a large amount of nitrogen reaches the interface between the silicon oxide film and the silicon substrate, a silicon nitride film is formed at this interface, and a physical film thickness of the dielectric film increases. When the film thickness increases excessively, the increase of the dielectric constant of the dielectric film does not compensate the increase of the film thickness, and the electrical film thickness increases as a result. Also, a large number of defects are generated at the interface, and the mobility of carriers decrease. As a result, the performance of the transistor decreases.

To increase the performance of the transistor, it is preferable to introduce as much nitrogen as possible into a thicker dielectric film, and to reduce an equivalent film thickness (the electrical film thickness). However, when excessive radical nitriding is applied in the conventional manufacturing method of a semiconductor, a large amount of nitrogen reaches the interface between the thinnest dielectric film and the semiconductor substrate, and the performance of a transistor decreases. In this way, when dielectric films with a different film thickness are simultaneously radical-nitrided in the prior art, nitrogen concentration introduced into the dielectric film with a lower film thickness increases more, and the nitriding may reach as far as the interface between the dielectric film and the semiconductor substrate.

SUMMARY OF THE INVENTION

An object of the present invention is to provide a semiconductor device which has a plurality of types of transistors whose gate dielectric films have a film thickness different from one another, and nitrogen concentration of these individual gate dielectric films is optimized. Another object of the present invention is to provide a method for manufacturing this semiconductor device.

A semiconductor device according to the present invention includes a semiconductor substrate, and a plurality of types of transistors provided with gate dielectric films different in film thickness and nitrogen concentration from one another. To form the gate dielectric films, a plurality of types of dielectric films different in film thickness and nitrogen concentration from one another are formed, and radical nitriding is applied to these dielectric films.

It is preferable that the plurality of types of gate dielectric films be formed such that the gate dielectric film with a higher film thickness has a higher nitrogen concentration. With this constitution, in the gate dielectric film with a lower film thickness, the nitrogen is prevented from reaching an interface between the gate dielectric film and the semiconductor substrate. Simultaneously, in the gate dielectric film with a higher film thickness, the nitrogen concentration is increased, the dielectric constant is increased, and the high speed performance is increased in a transistor provided with this gate dielectric film.

An alternative semiconductor device according to the present invention includes a semiconductor substrate, and a plurality of types of transistors provided with gate dielectric films different in film thickness and nitrogen concentration from one another. A non-radical nitrided layer is provided on the side in contact with the semiconductor substrate in the gate dielectric films. The non-radical nitrided layer means an area that the radical nitrogen does not reach in the radical nitriding.

In a method for manufacturing a semiconductor device according to the present invention, a plurality of types of dielectric films different in film thickness and nitrogen concentration from one another are formed on a semiconductor substrate. Then, radical nitriding is applied to these dielectric films to form a plurality of types of gate dielectric films.

In the present invention, since the dielectric films containing nitrogen are formed on the semiconductor substrate, the contained nitrogen blocks nitrogen introduced in the radical nitriding to arbitrarily control the amounts of the nitrogen introduced into the gate dielectric films by the radical nitriding. Therefore, by making the nitrogen concentrations in the plurality of types of dielectric films different from one another, the nitrogen concentrations in the plurality of types of gate dielectric films are individually and optimally controlled.

The plurality of types of dielectric films can be formed such that the dielectric film with a lower film thickness has a higher nitrogen concentration. Consequently, the introduction of the nitrogen is more effectively blocked in the dielectric film with a lower film thickness in the radical nitriding. As a result, in the dielectric film with a lower film thickness, the nitrogen is prevented from reaching an interface between the dielectric film and the semiconductor substrate. Simultaneously, in the dielectric film with a higher film thickness, a larger amount of nitrogen is introduced in the radical nitriding.

In the step of forming the plurality of types of dielectric films, it is possible to form a second and the following dielectric films as follows. That is, the surface of the semiconductor substrate is divided into a plurality of regions, and a first dielectric film is formed so as to cover the individual regions. Then, the first dielectric film formed on a second region is selectively removed, and a second dielectric film with a lower film thickness and a higher nitrogen concentration than the first dielectric film is formed on the second region. After the second dielectric film is formed, the dielectric film formed on an nth ((n) is a natural number equal to or more than 3) region is removed, and a dielectric film with a lower film thickness and a higher nitrogen concentration than a dielectric film formed on an (n−1)th region is formed on the nth region. Consequently, since the second dielectric film whose film thickness is lower is formed after the formation of the first dielectric film whose film thickness is higher, the second dielectric film is not damaged when the first dielectric film is formed.

In the step of forming the plurality of types of dielectric films, it is also possible to form a second and the following dielectric films as follows. That is, the surface of the semiconductor substrate is divided into a plurality of regions, and a first dielectric film is formed so as to cover the individual regions. Then, the first dielectric film formed on a second region is selectively removed, and a second dielectric film with a higher film thickness and a lower nitrogen concentration than the first dielectric film is formed on the second region. After the second dielectric film is formed, the dielectric film formed on an nth ((n) is a natural number equal to 3 or more) region is removed, and a dielectric film with a higher film thickness and a lower nitrogen concentration than a dielectric film formed on an (n−1)th region is formed on the nth region. A protection film may be formed on the first to (n−1)th regions for preventing the dielectric film formed on the nth region from being formed on these regions when the dielectric film is formed on the nth region. With this constitution, since the second dielectric film is formed while the protection film is formed on the first dielectric film, it is possible to prevent the step for forming the second dielectric film from affecting the film thickness and the nitrogen concentration of the first dielectric film. The protection film may be a silicon nitride film, for example.

It is preferable that the semiconductor substrate be a silicon substrate, and the step of forming the dielectric film be a step of oxidizing or oxynitriding a surface layer of the silicon substrate to form a silicon oxide or oxynitride film. Consequently, since the surface layer of the silicon substrate is nitrided or oxynitrided, the dielectric films are easily formed.

It is preferable that in the radical nitriding, nitrogen radical be formed in a first chamber, the nitrogen radical be introduced into a second chamber, which is connected with the first chamber, and stores the semiconductor substrate, and the nitrogen radical come in contact with the dielectric film formed on the semiconductor substrate in the second chamber.

Consequently, plasma is formed to form the nitrogen radical outside the second chamber where the semiconductor substrate is placed. As a result, it is possible to prevent the plasma from damaging the dielectric film on the semiconductor substrate.

In an alternative method of manufacturing a semiconductor device according to the present invention, a plurality of types of dielectric films different in film thickness from one another are formed on a semiconductor substrate. Then, radical nitriding is applied to the dielectric films such that nitrogen does not reach an interface between the dielectric film with the lowest film thickness, and the semiconductor substrate. As a result, a plurality of types of gate dielectric films are formed.

In this way, with the present invention, when a semiconductor device includes a plurality of types of transistors, and the film thickness of the gate dielectric film of these transistors is different from one another, the nitrogen concentration is optimized in the individual gate dielectric films. Consequently, the characteristics of the individual transistors, namely the high speed performance and the gate leak current, are optimized.

DETAILED DESCRIPTION OF THE PREFERRED EMBODIMENTS

Figure 1A:
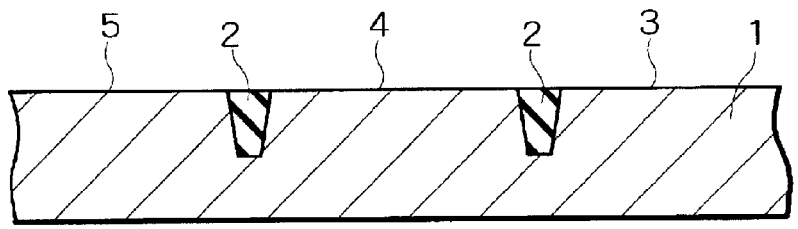
FIGS. 1A to 1D are sectional views showing a method for manufacturing a semiconductor device using radical nitriding according to a first embodiment of the present invention while these sectional views are arranged in the sequence.
Figure 1B:
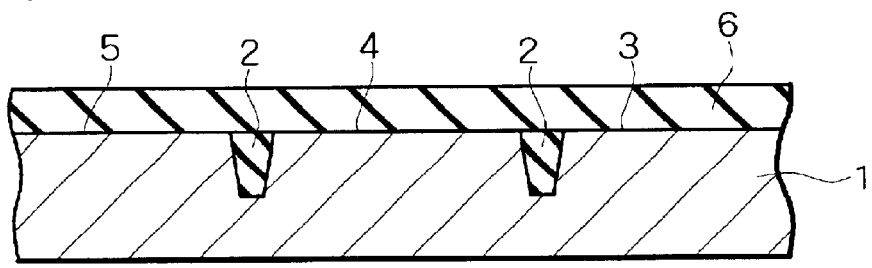

The following specifically describes embodiments of the present invention while referring to the attached drawings. First, a first embodiment of the present invention will be described. FIGS. 1A to 1D and FIGS. 2A to 2C are sectional views showing a method for manufacturing a semiconductor device using radical nitriding according to the present embodiment while these sectional views are arranged in the process sequence. First, a silicon substrate 1 is placed in a chamber (not shown) as shown in FIG. 1A. Device isolation trenches 2 are formed on the silicon substrate 1, and divide the surface of the silicon substrate 1 into a region 3 to a region 5. Then, when heat treatment is applied to the silicon substrate 1, the surface of the silicon substrate 1 is oxidized, and a silicon oxide film 6 with a film thickness of 5 to 7 nm is formed on the regions 3 to 5 as shown in FIG. 1B. As the conditions of the heat treatment, atmospheric gas is mixed gas with a pressure of 1 atm produced by mixing $H_2$ gas and $O_2$ gas at a ratio of 1:1, the temperature is about 750° C., and the treatment time is about 20 minutes.

Figure 1C:
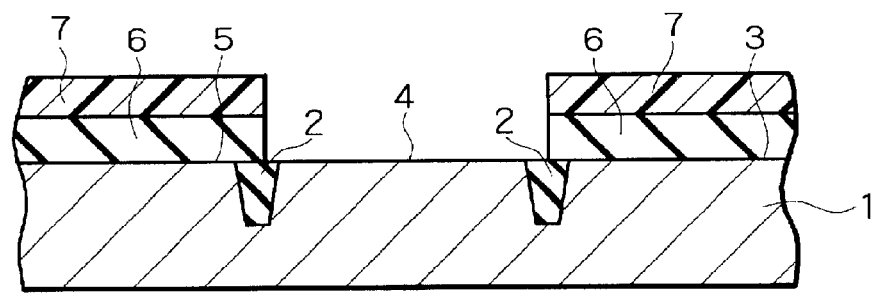
Figure 1D:
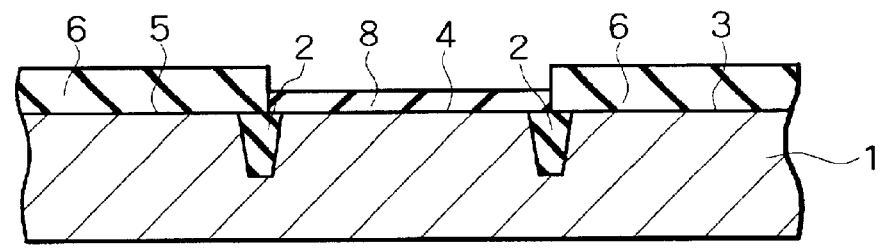

Then, a resist 7 having an opening on the region 4 is formed on the silicon oxide film 6 as shown in FIG. 1C. After this step, the silicon oxide film 6 is etched with this resist 7 as a mask, and the silicon oxide film 6 is removed on the region 4. Then, the resist 7 is removed, and oxynitriding is applied as shown in FIG. 1D. This oxynitriding is applied in an NO atmosphere at a pressure of 1.3 to 6.7 kPa and at a temperature of 500 to 700° C. for 10 to 30 seconds. Then, the oxynitriding continues to be applied in an $O_2$ atmosphere at a pressure of 6.7 to 20 kPa and at a temperature of 900 to 1050° C. for 50 to 100 seconds. Consequently, a silicon oxynitride film 8 with a film thickness of 2 to 3 nm, and a nitrogen concentration of 1 to 3 atom % is formed on the region 4. The silicon oxide film 6 is more or less oxynitrided on the regions 3 and 5.

Figure 2A:
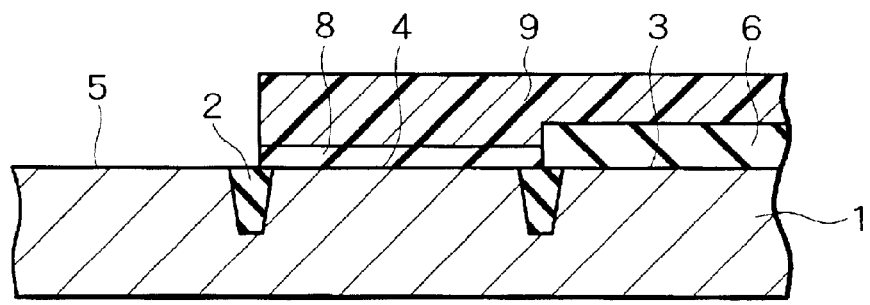
FIGS. 2A to 2C are sectional views showing the method for manufacturing a semiconductor device using radical nitriding according to the present embodiment while these sectional views are arranged in the sequence, and these sectional views indicate steps following those shown in FIGS. 1A to FIG. 1D.
Figure 2B:
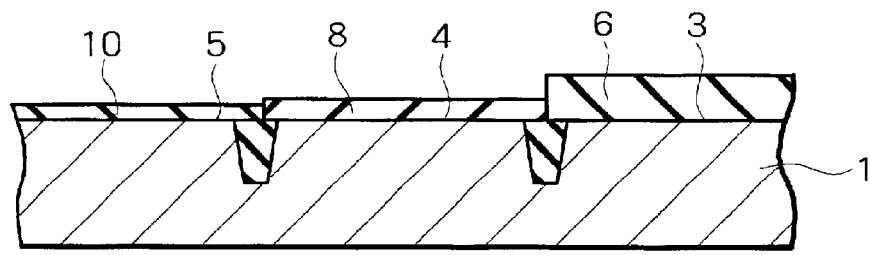

Then, a resist 9 having an opening on the region 5 is formed as shown FIG. 2A. The silicon oxide film 6 (see FIG. 1D) on the region 5 is etched with this resist 9 as a mask, and the silicon oxide film 6 is removed. Then, the resist 9 is removed, and oxynitriding is applied in an NO atmosphere at a pressure of 1.3 to 6.7 kPa and at a temperature of 500 to 700° C. for 10 to 20 seconds as shown in FIG. 2B. Consequently, a silicon oxynitride film 10 with a film thickness of 1 to 2 nm, and a nitrogen concentration of 3 to 5 atom % is formed on the region 5. The silicon oxide film 6 and the silicon oxynitride film 8 are more or less oxynitrided in this step.

Figure 2C:
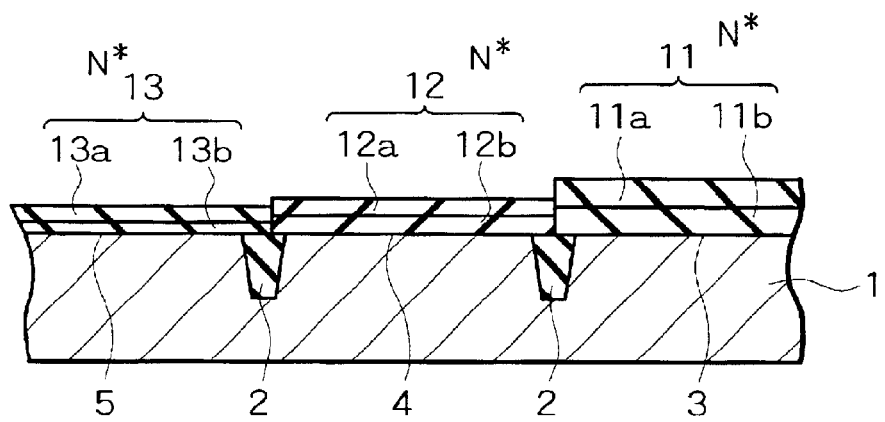

Then, radical nitriding is applied to the silicon oxide film 6, and the silicon oxynitride films 8 and 10 as shown in FIG. 2C. N* indicates nitrogen radical in FIG. 2C. The nitrogen radical is formed in another chamber connected with the chamber where the silicon substrate 1 is placed. As the conditions for forming the nitrogen radical, mixed gas produced by mixing He and $N_2$ at a ratio of 1:1 is filled in the another chamber so as to present a pressure of 370 to 400 Pa, and is heated to 500 to 600° C. Microwave with the output of 3000 W is impressed on this heated mixed gas. Consequently, plasma is formed to form the nitrogen radical. Ammonia may be used as a source material for generating the nitrogen radical in place of the mixed gas. The nitrogen radical is introduced into the chamber where the silicon substrate 1 is placed, and come into contact with the silicon oxide film 6, and the silicon oxynitride films 8 and 10 formed on the silicon substrate 1. Consequently, the silicon oxide film 6 and the silicon oxynitride films 8 and 10 are radical-nitrided. The time for the radical nitriding is 80 to 150 seconds. The nitrogen radical (N*) is mixture of $N^+$ radical, N radical, and $N_2$ radical in the present embodiment.

In this step, the silicon oxide film 6 and the silicon oxynitride films 8 and 10 are nitrided from the surface side. Because the silicon oxide film 6 includes little nitrogen, the nitrogen introduced in the radical nitriding is not blocked, and the nitrogen concentration increases consequently. As a result, the silicon oxide film 6 is radical-nitrided such that a silicon oxynitride film 11 with a nitrogen concentration of 10 to 15 atom % is formed.

Nitrogen of 2 to 3 atom % has been introduced into the silicon oxynitride film 8. Thus, this nitrogen serves as a block, and the amount of the nitrogen introduced into the silicon oxynitride film 8 in the radical nitriding is smaller than the amount of the nitrogen introduced into the silicon oxide film 6. As a result, the silicon oxynitride film 8 is radical-nitrided such that a silicon oxynitride film 12 with a nitrogen concentration of 8 to 12 atom % is formed.

Nitrogen of 3 to 5 atom % has been introduced into the silicon oxynitride film 10. The nitrogen serves as a block, and the amount of the nitrogen introduced into the silicon oxynitride film 10 in the radical nitriding is smaller than the amount of the nitrogen introduced into the silicon oxynitride film 8. Thus the silicon oxynitride film 10 is radical-nitrided, and a silicon oxynitride film 13 with a nitrogen concentration of 6 to 10 atom % is formed. The silicon oxynitride films 11 to 13 respectively function as a gate dielectric film of a transistor. After this step, gate poly is grown on the silicon oxynitride films 11 and 13 to form gate electrodes (not shown). Consequently, a semiconductor device having a plurality of types of transistors is manufactured.

As shown in FIG. 2C, in the semiconductor device of the present embodiment, the silicon substrate 1 is provided. The device isolation trenches 2 divide the surface of the silicon substrate 1 into the regions 3 to 5. The silicon oxynitride films 11 to 13 serving as a gate dielectric film of a transistor are respectively formed on the regions 3 to 5. The silicon oxynitride film 11 has a film thickness of 5 to 7 nm, and a nitrogen concentration of 10 to 15 atom %. The silicon oxynitride film 12 has a film thickness of 2 to 3 nm, and a nitrogen concentration of 8 to 12 atom %. The silicon oxynitride film 13 has a film thickness of 1 to 2 nm, and a nitrogen concentration of 6 to 10 atom %. The nitrogen concentration is distributed such that the concentration is highest at the surface, and monotonically and continuously decreases from the surface to the interface to the silicon substrate 1 in the film thickness direction in the silicon oxynitride films 11 to 13, and little nitrogen is introduced at the interface to the silicon substrate 1. Thus, the silicon oxynitride films 11 to 13 respectively comprise radical nitrided layers 11a to 13a that are formed at an upper layer, and the radical nitrogen has reached in the radical nitriding, and non-radical nitrided layers 11b to 13b which are formed at a lower layer, and the radical nitrogen has not reached in the radical nitriding.

Since the silicon oxynitride film is used as the gate dielectric film in the present embodiment, the dielectric constant can be increased compared with a case where a silicon oxide film is used. Thus, since an effective film thickness of the gate dielectric film can be scaled, and the physical film thickness increases simultaneously, the gate leak current can be decreased.

Since the radical nitriding is used to introduce nitrogen into the silicon oxynitride film, the nitrogen can be introduced from the surface of the silicon oxynitride film. Thus, the non-radical nitrided layers 11b to 13b are formed near the interface to the silicon substrate 1 in the silicon oxynitride films 11 to 13. As a result, a formation of a nitride layer and a generation of a defect are restrained at the interface between the silicon substrate and the silicon oxynitride film. The present embodiment is an example of forming the non-radical nitrided layers 11b to 13b respectively in the plurality of gate dielectric films (the silicon oxynitride films 11 to 13) with the film thickness different from one another. However, it is only necessary not to introduce a large amount of nitrogen at the interface between the gate dielectric films and the semiconductor substrate in any of the gate dielectric films when the radical nitriding is applied simultaneously to the plurality of gate dielectric films with the film thickness different from one another in the present invention.

The silicon oxide film 6 and the silicon oxynitride films 8 and 10 whose film thickness and nitrogen concentration are different from one another are formed on the silicon substrate 1, and then the radical nitriding is applied in the present embodiment. As a result, the nitrogen in the silicon oxynitride films 8 and 10 blocks the nitrogen introduced into the silicon oxynitride films 8 and 10 during the radical nitriding. In this step, the radical nitriding is applied while the silicon oxynitride film 10 with the lowest film thickness contains a large amount of nitrogen, and the silicon oxide film 6 with the highest film thickness does not contain nitrogen. Consequently, a sufficient amount of nitrogen is introduced into the silicon oxide film 6 to increase the dielectric constant, and to decrease the effective film thickness while the nitrogen is restrained from reaching the interface between the silicon oxynitride film 10 and the silicon substrate 1. Thus, for example, when the silicon oxynitride film 11 is used as a gate dielectric film for an I/O transistor, the silicon oxynitride film 12 is used as a gate dielectric film for an LP transistor, and the silicon oxynitride film 13 is used as a gate dielectric film for a core transistor, the performance of the individual transistors is optimized. In this case, it is preferable that the silicon oxynitride film 13 used as the gate dielectric film for the core transistor have a film thickness of 1 nm or more for restraining the gate leak current. Also, it is preferable that the silicon oxynitride film 11 used as the gate dielectric film for the I/O transistor has a film thickness of 5 nm or more for securing voltage-withstanding capability.

Figure 3:
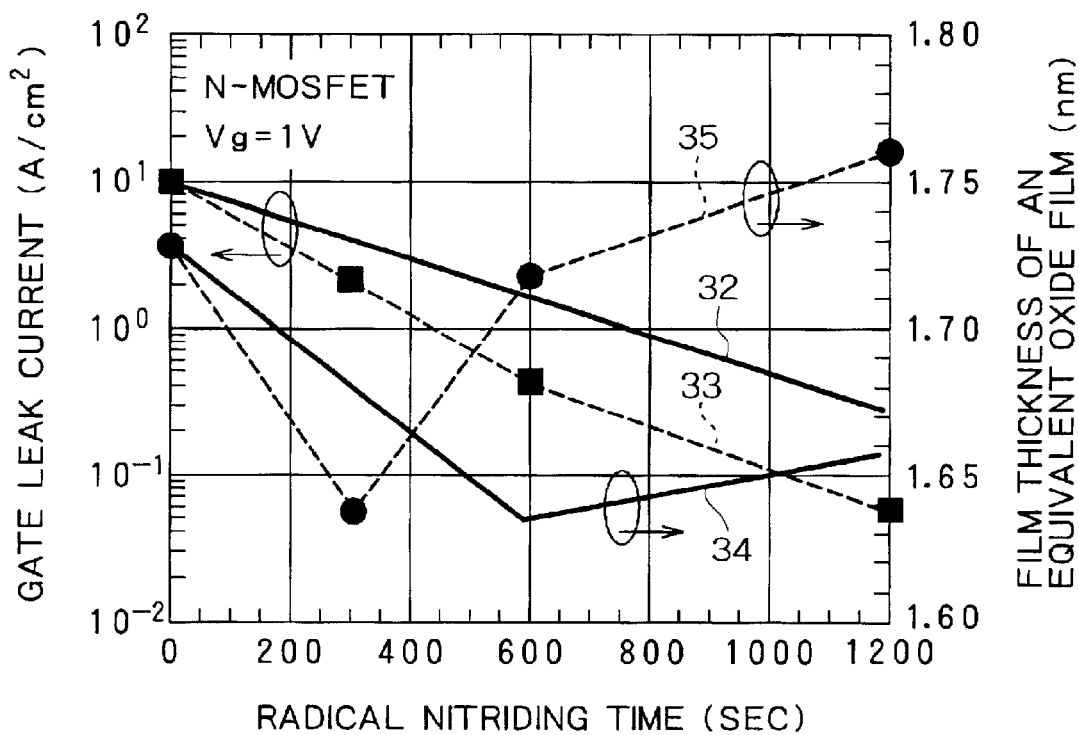
FIG. 3 is a graph showing a difference in radical nitriding behavior between when an oxide film is used as a dielectric film and when an oxynitride film is used as the dielectric film while a radical nitriding time is assigned to the horizontal axis, and the film thickness of an equivalent oxide film of a gate dielectric film, and a gate leak current of this gate dielectric film are assigned to the vertical axes.

Next, the following details a difference in radical nitriding behavior between when an oxide film is used as a dielectric film, and when an oxynitride film is used as the dielectric film before radical nitriding in the step of applying the radical nitriding to the dielectric films to form the gate dielectric films. FIG. 3 is a graph showing a difference in radical nitriding behavior between when an oxide film is used as the dielectric film and when an oxynitride film is used as the dielectric film while a radical nitriding time is assigned to the horizontal axis, and the film thickness of the equivalent oxide film of the gate dielectric film, and the gate leak current of this gate dielectric film are assigned to the vertical axes. The film thickness of the equivalent oxide film of the dielectric film is obtained by converting the physical film thickness of the dielectric film into the film thickness of the equivalent oxide film while taking account of the change of the dielectric constant as a result of the nitrogen introduction. The equivalent film thickness is a so-called electric film thickness. A line 32 indicates the gate leak current when the dielectric film is an oxynitride film, and a line 33 indicates the gate leak current when the dielectric film is an oxide film. A line 34 indicates the film thickness of an equivalent oxide film when the dielectric film is an oxynitride film, and a line 35 indicates the film thickness of an equivalent oxide film when the dielectric film is an oxide film.

When the dielectric film is an oxide film as shown in FIG. 3, if the time for the radical nitriding is long, the nitrogen reaches the interface between the oxide film and the substrate, and the physical film thickness increases. Consequently, the gate leak current decreases as the line 33 shows, simultaneously the film thickness of the equivalent oxide film increases as the line 35 shows, and the high speed performance of the transistor decreases accordingly. Thus, the time for the radical nitriding should not be long, and should be set to short.

On the other hand, when the dielectric film is an oxynitride film, there is such an effect as the nitrogen that has been introduced into this oxynitride film blocks the nitrogen to be introduced by the radical nitriding. Consequently, as the line 34 shows, the increase of both the electric film thickness and the physical film thickness becomes more gradual than the line 35 with respect to the radical nitriding time. Thus, the time for the radical nitriding can be longer. Thus, when an oxynitride film is formed as a dielectric film with a low film thickness, an oxide film is formed as a dielectric film with a high film thickness, and then the radical nitriding is applied, a sufficient amount of nitrogen is introduced into the dielectric film with the high film thickness. With this constitution, only with a single application of the radical nitriding, optimal nitrogen concentration is realized in the individual dielectric films.

Generally, a silicon oxynitride film is damaged in steps of applying a resist on the silicon oxynitride film, and removing the resist from the silicon oxynitride film. However, the thinnest silicon oxynitride film 10 is formed last in the present embodiment. Thus, a resist is not formed on the silicon oxynitride film 10 in the manufacturing step of the semiconductor device, and the silicon oxynitride film 10 is not damaged. Therefore, the reliability of the semiconductor device increases.

Figure 4:
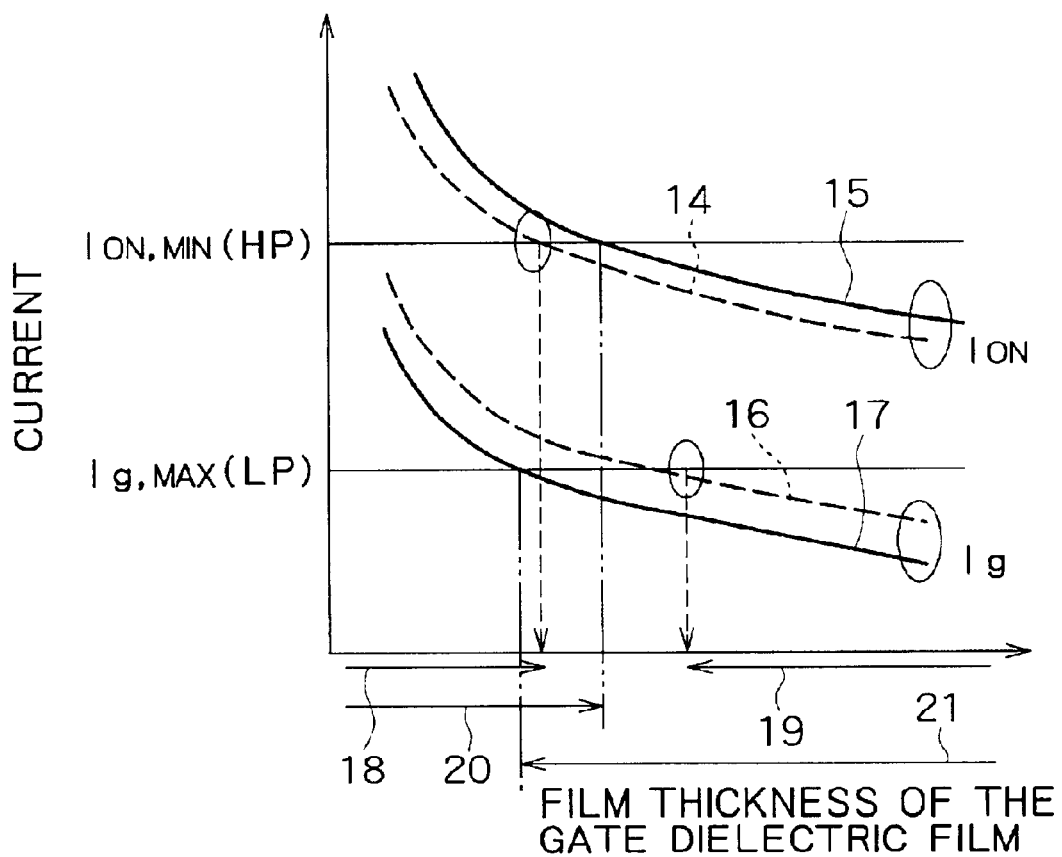
FIG. 4 is a graph showing ranges of a permissible film thickness of a gate dielectric film of an HP transistor and an LP transistor while the film thickness of the gate dielectric film is assigned to the horizontal axis, and the on-current and the gate leak current of the transistors are assigned to the vertical axes.

When the gate dielectric film of the LP transistor is scaled, the gate dielectric film of the LP transistor and the gate dielectric film of the HP (MP) transistor (the core transistor) can have the same film thickness in the present invention. FIG. 4 is a graph showing ranges of a permissible film thickness of the gate dielectric film for the HP transistor and the LP transistor. The film thickness of the gate dielectric film is assigned to the horizontal axis, and the on-current and the gate leak current of the transistors are assigned to the vertical axes. In FIG. 4, a broken line 14 shows a relationship between the film thickness of the gate dielectric film and the on-current of a conventional transistor whose gate dielectric film is a silicon oxide film. A broken line 16 in the same drawing shows a relationship between the film thickness of the gate dielectric film and the gate leak current in this conventional transistor. A solid line 15 shows a relationship between the film thickness of the gate dielectric film and the on-current of a transistor whose gate dielectric film is a silicon oxynitride film of the present invention. A solid line 17 shows a relationship between the film thickness of the gate dielectric film and the gate leak current in this transistor.

Since the on-current (the broken line 14) of the HP (MP) transistor should be $I_{ON,\ MIN}$ (HP) or more as shown in FIG. 4, the film thickness of the gate dielectric film of the HP (MP) transistor should be within a range 18 for the conventional transistor structure. Since the gate leak current (the broken line 16) of the LP transistor should be $I_{g,\ MAX}$ (LP) or less, the film thickness of the gate dielectric film of the LP transistor should be within a range 19 for the conventional transistor structure. Since the range 18 and the range 19 do not overlap each other, it is necessary that the film thickness of the gate dielectric film of the HP (MP) transistor, and the film thickness the gate dielectric film of the LP transistor are set independently to each other. Thus, the HP (MP) transistor and the LP transistor do not have the common gate dielectric film.

On the other hand, since the on-current of the HP (MP) transistor (the solid line 15) of the present invention is larger than the on-current of the conventional HP (MP) transistor, it is possible to set the film thickness of the gate dielectric film of the HP (MP) transistor of the present invention within a range 20. Also, since the gate leak current (the solid line 17) of the LP transistor of the present invention is smaller than the gate leak current of the conventional LP transistor, it is possible to set the film thickness of the gate dielectric film of the LP transistor of the present invention within a range 21. Since the range 20 and the range 21 overlap each other as shown in FIG. 4, when a gate dielectric film is produced so as to have its film thickness within a rage where the range 20 and the range 21 overlap, this gate dielectric film can be applied to both the HP (MP) transistor and the LP transistor. Namely, a film thickness that simultaneously satisfies securing the on-current, and reducing the gate leak current exists in the present invention. Thus, the gate dielectric film can be commonly used both for the HP (MP) transistor and the LP transistor.

Figure 5A:
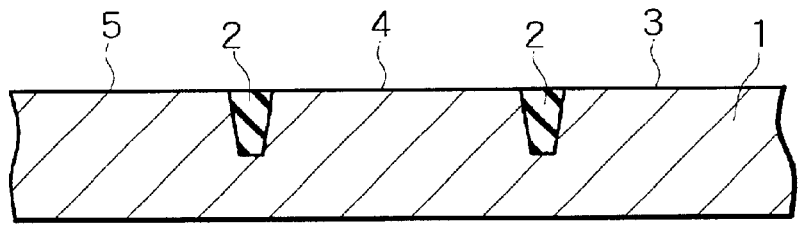
FIGS. 5A to 5D are sectional views showing a method for manufacturing a semiconductor device using radical nitriding according to a second embodiment of the present invention while these sectional views are arranged in the sequence.
Figure 5B:
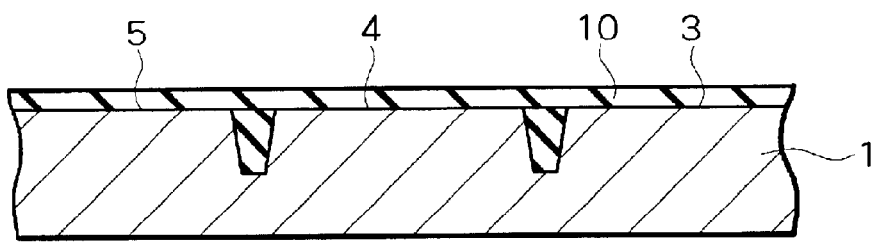

The following describes a second embodiment of the present invention. FIGS. 5A to 5D and FIGS. 6A to 6D are sectional views showing a method for manufacturing a semiconductor device using radical nitriding according to the present embodiment while these sectional views are arranged in the process sequence. First, a silicon substrate 1 is placed in a chamber (not shown) as shown in FIG. 5A. Device isolation trenches 2 are formed on the silicon substrate 1, and divide the surface of the silicon substrate 1 into a region 3 to a region 5. Then, when heat treatment is applied to the silicon substrate 1, the surface of the silicon substrate 1 is oxidized, and a silicon oxynitride film 10 with a film thickness of 1 to 2 nm, and a nitrogen concentration of 3 to 5 atom % is formed on the regions 3 to 5 as shown in FIG. 5B. The silicon oxynitride film 10 is formed by applying the heat treatment for 10 to 20 seconds in an NO atmosphere which has a pressure of 1.3 to 6.7 kPa, and a temperature of 500 to 700° C.

Figure 5C:
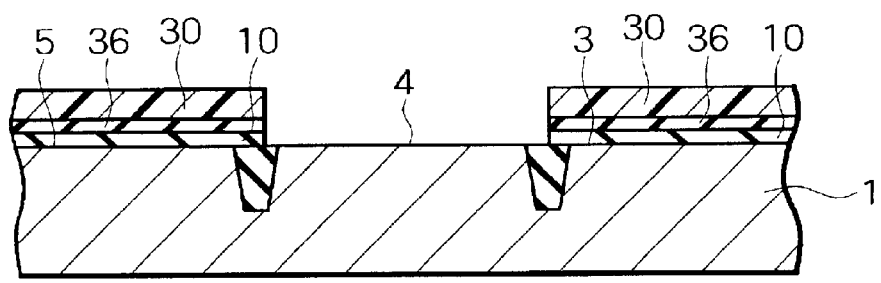
Figure 5D:
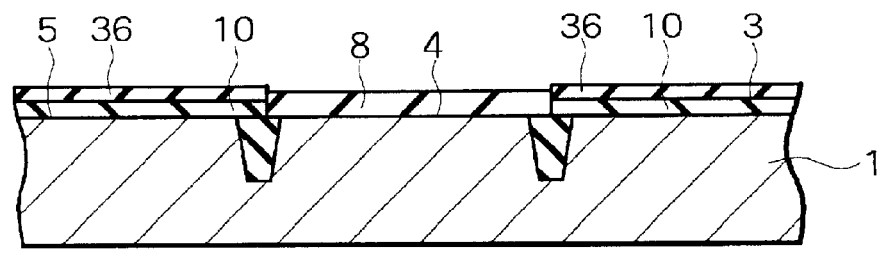

Then, a silicon nitride film 36 is formed on the silicon oxynitride film 10, and a resist 30 having an opening on the region 4 is formed on the silicon nitride film 36 as shown in FIG. 5C. The silicon nitride film 36, and the silicon oxynitride film 10 are etched with this resist 30 as a mask, and the silicon nitride film 36, and the silicon oxynitride film 10 are removed on the region 4. Then, the resist 30 is removed, and oxynitriding is applied as shown in FIG. 5D. This oxynitriding is applied in an NO atmosphere at a pressure of 1.3 to 6.7 kPa and at a temperature of 500 to 700° C. for 10 to 30 seconds, and then, the oxynitriding continues to be applied in an $O_2$ atmosphere at a pressure of 6.7 to 20 kPa and at a temperature of 900 to 1050° C. for 50 to 100 seconds. Consequently, a silicon oxynitride film 8 with a film thickness of 2 to 3 nm, and a nitrogen concentration of 1 to 3 atom % is formed on the region 4 while the film thickness and the nitrogen concentration of the silicon oxynitride film 10 on the regions 3 and 5 are maintained.

Figure 6A:
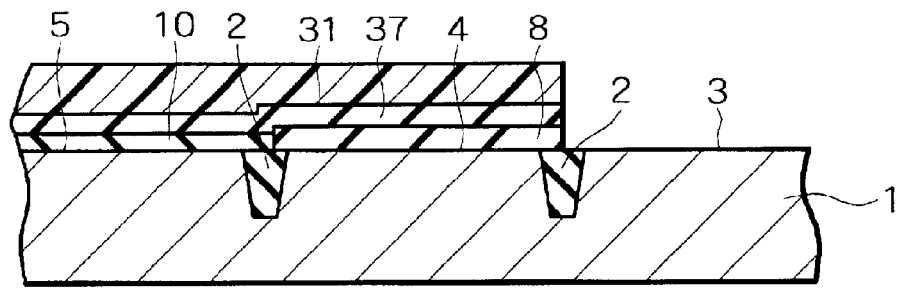
FIGS. 6A to 6D are sectional views showing the method for manufacturing a semiconductor device using radical nitriding according to the present embodiment while these sectional views are arranged in the sequence, and these sectional views indicate steps following those shown in FIGS. 5A to FIG. 5D.
Figure 6B:
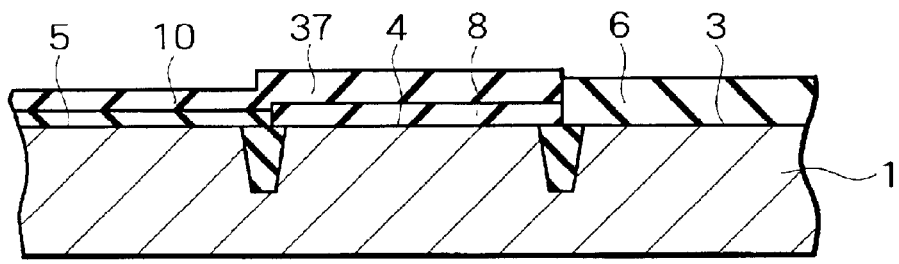
Figure 6C:
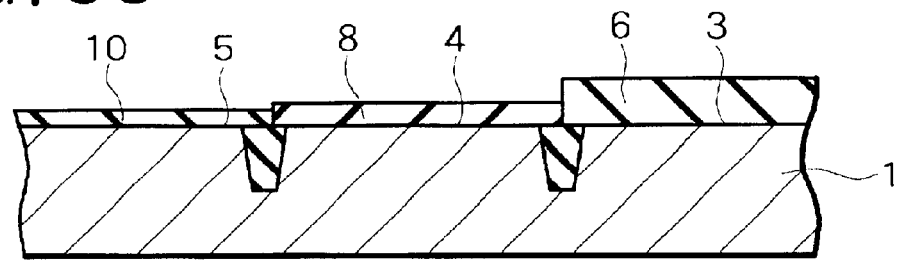

Then, the silicon nitride film 36 (see FIG. 5D) is removed, a silicon nitride film 37 is newly formed, and a resist 31 having an opening on the region 3 is formed as shown FIG. 6A. After this step, the silicon nitride film 37 and the silicon oxynitride film 10 are etched with this resist 31 as a mask, and the silicon nitride film 37 and the silicon oxynitride film 10 are removed on the region 3. Then, the resist 31 is removed, and heat treatment is applied as shown in FIG. 6B. As the conditions for this heat treatment, atmospheric gas is mixed gas with a pressure of 1 atm, the mixed gas is produced by mixing $H_2$ gas and $O_2$ gas at a ratio of 1:1, the temperature is about 750° C., and the treatment is applied for about 20 minutes. After this treatment, the silicon nitride film 37 is removed. Consequently, a silicon oxide film 6 with a film thickness of 5 to 7 nm is formed on the region 3 while the film thickness and the nitrogen concentration of the silicon oxynitride films 8 and 10 are maintained.

Figure 6D:
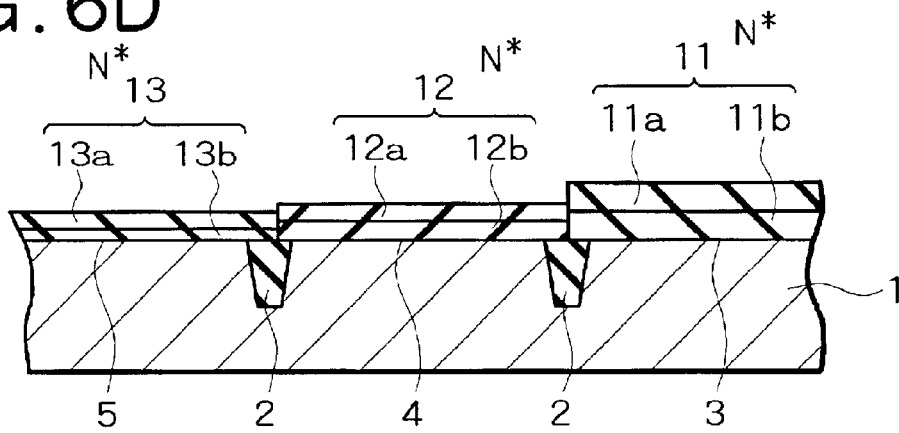

Then, radical nitriding is applied to the silicon oxide film 6, and the silicon oxynitride films 8 and 10 as shown in FIG. 6D. N* indicates nitrogen radical in FIG. 6D. The radical nitriding in the present embodiment is the same as the radical nitriding shown in the first embodiment described before.

As a result, as in the first embodiment, the silicon oxide film 6 is radical-nitrided to form a silicon oxynitride film 11 with a nitrogen concentration of 10 to 15 atom %. The silicon oxynitride film 8 is radical-nitrided to form a silicon oxynitride film 12 with a nitrogen concentration of 8 to 12 atom %. The silicon oxynitride film 10 is radical-nitrided to form a silicon oxynitride film 13 with a nitrogen concentration of 6 to 10 atom %. The silicon oxynitride films 11 to 13 respectively function as a gate dielectric film of transistors. After this step, gate poly is grown on the silicon oxynitride films 11 and 13 to form gate electrodes (not shown). Consequently, a semiconductor device having a plurality of types of transistors is manufactured. The semiconductor device according to the present embodiment, which is manufactured in this way, has the same constitution as the semiconductor device of the first embodiment.

In the present embodiment, the resist 30 which has the opening only on the region 4 is formed in the step shown in FIG. 5C, and the silicon oxynitride film 8 is formed only on the region 4 in the step shown in FIG. 5D. However, a resist which has openings on the regions 3 and 4 may be formed in the step shown in FIG. 5C, and the silicon oxynitride film 8 may be formed on the regions 3 and 4 in the step shown in FIG. 5D.

Since the silicon oxynitride film is used as the gate dielectric film in the present embodiment as in the first embodiment, the dielectric constant can be increased compared with a case where a silicon oxide film is used. Thus, since the effective film thickness of the gate dielectric film can be scaled, and the physical film thickness increases simultaneously, the gate leak current can be decreased.

The nitrogen in the silicon oxynitride films 8 and 10 blocks the nitrogen introduced into the silicon oxynitride films 8 and 10 during the radical nitriding. Therefore, a sufficient amount of nitrogen is introduced into the silicon oxide film 6 to increase the dielectric constant, and to decrease the effective film thickness while the nitrogen is restrained from reaching the interface between the silicon oxynitride film 10 and the silicon substrate 1. Consequently, the performances of the individual transistors are optimized.

The manufacture of a semiconductor device according to the present embodiment has the following effects compared with the first embodiment. The silicon oxynitride film 10 formed on the region 5 in the step shown in FIG. 5B is protected by the silicon nitride film 36 in the oxynitriding in the step shown in FIG. 5D. The silicon oxynitride film 10 is protected by the silicon nitride film 37 in the oxynitriding in the step shown in FIG. 6B. Thus, the silicon oxynitride film 10 is not nitrided in these oxynitriding steps. In the same way, the silicon oxynitride film 8 formed on the region 4 in the step shown in FIG. 5D is protected by the silicon nitride film 37 and the resist 31 in the oxynitriding in the step shown in FIG. 6B. Thus, the silicon oxynitride film 8 is not nitrided in this oxynitriding. Consequently, the nitrogen concentrations in the silicon oxynitride films 8 and 10 are precisely controlled in the radical nitriding. As a result, the nitrogen concentrations in the silicon oxynitride films 11 and 13 formed in the radical nitriding are precisely controlled.

However, since the silicon nitride films 36 and 37 are formed on, and removed from the thin silicon oxynitride film 10, the silicon oxynitride film 10 tends to be damaged in the method of the present embodiment compared with the first embodiment. Thus, the reliability of the semiconductor device decreases more or less. Therefore, it is preferable to use the method of the first embodiment for manufacturing semiconductor devices when the reliability of the semiconductor devices is prioritized over the precision of the nitrogen concentrations in the silicon oxynitride films 11 to 13. On the other hand, it is preferable to use the method of the second embodiment for manufacturing semiconductor devices when the precision of the nitrogen concentrations in the silicon oxynitride films 11 to 13 is prioritized over the reliability of the semiconductor devices.

Figure 7A:
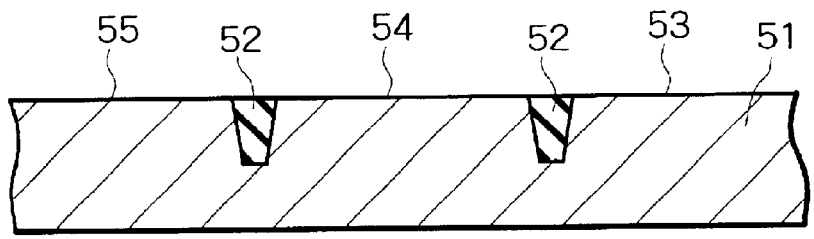
FIGS. 7A to 7D are sectional views showing a method for manufacturing a semiconductor device using radical nitriding according to a third embodiment of the present invention while these sectional views are arranged in the sequence.
Figure 7B:
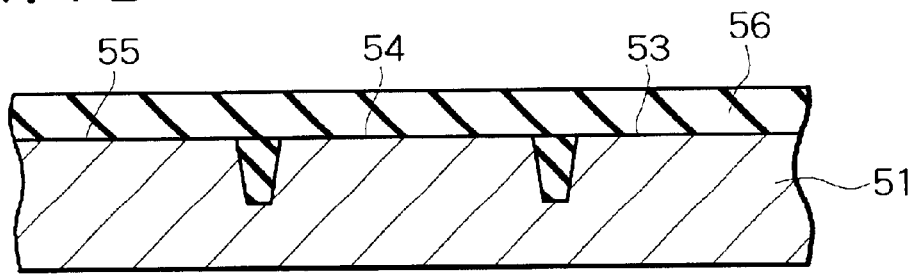

The following describes a third embodiment of the present invention. FIGS. 7A to 7D and FIGS. 8A to 8C are sectional views showing a method for manufacturing a semiconductor device using radical nitriding according to the present embodiment while these sectional views are arranged in the process sequence. First, a silicon substrate 51 is provided as shown in FIG. 7A. Device isolation trenches 52 divide the surface of the silicon substrate 51 into a region 53 to a region 55. Then, a silicon oxide film 56 with a film thickness of 5 to 7 nm is formed by thermal oxidation on the regions 53 to 55 of the silicon substrate 51 as shown in FIG. 7B. As the conditions of the thermal oxidation, atmospheric gas is mixed gas with a pressure of 1 atm, the mixed gas is produced by mixing $H_2$ gas and $O_2$ gas at a ratio of 1:1, the temperature is about 750° C., and the oxidation time is about 20 minutes.

Figure 7C:
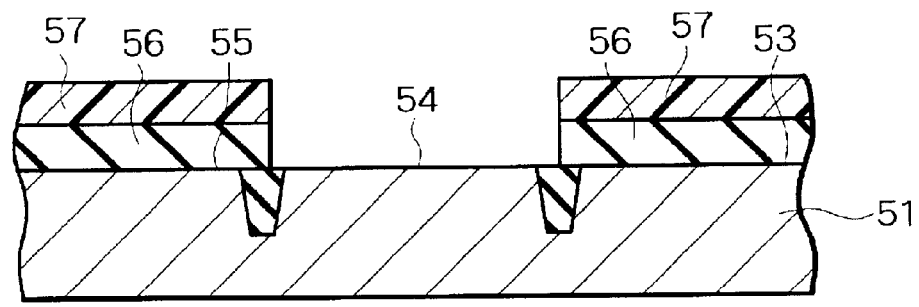
Figure 7D:
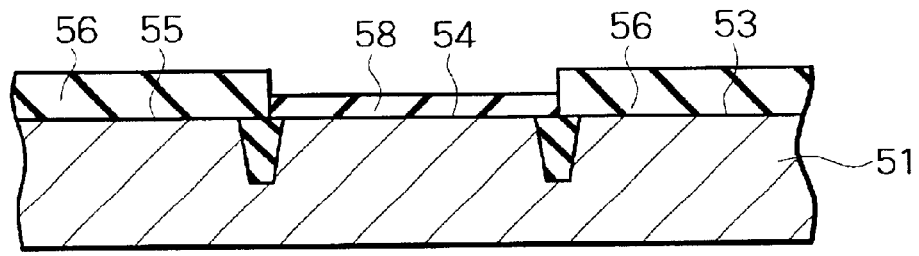

Then, a resist 57 having an opening on the region 54 is formed on the silicon oxide film 56 as shown in FIG. 7C. The silicon oxide film 56 is etched with this resist 57 as a mask, and the silicon oxide film 56 is removed on the region 54. Then, the resist 57 is removed, and a silicon oxide film is formed as shown in FIG. 7D. This silicon oxide film is formed by heat treatment in an $O_2$ atmosphere at a pressure of 6.7 to 20 kPa and at a temperature of 900 to 1050° C. for 50 to 100 seconds, or by processing in an atmosphere of mixed gas which is produced by mixing $H_2$ gas and $O_2$ gas at a ratio of 1:1, and has a pressure of 1 atm and at a temperature of about 750° C. for about ten minutes. Consequently, a silicon oxide film 58 with a film thickness of 2 to 3 nm is formed on the region 54.

Figure 8A:
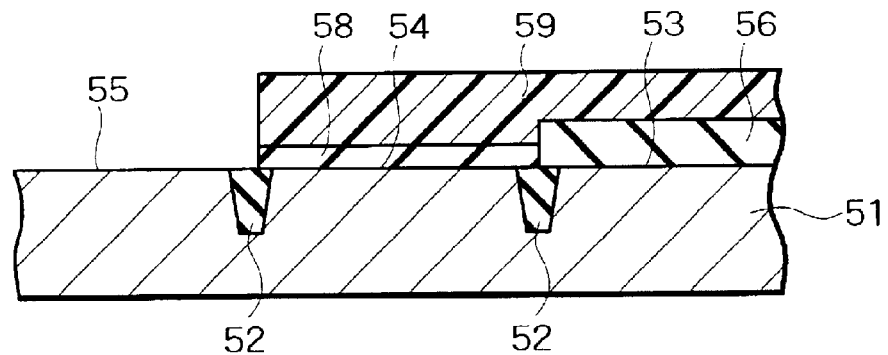
FIGS. 8A to 8C are sectional views showing the method for manufacturing a semiconductor device using radical nitriding according to the present embodiment while these sectional views are arranged in the sequence, and these sectional views indicate steps following those shown in FIGS. 7A to FIG. 7D.
Figure 8B:
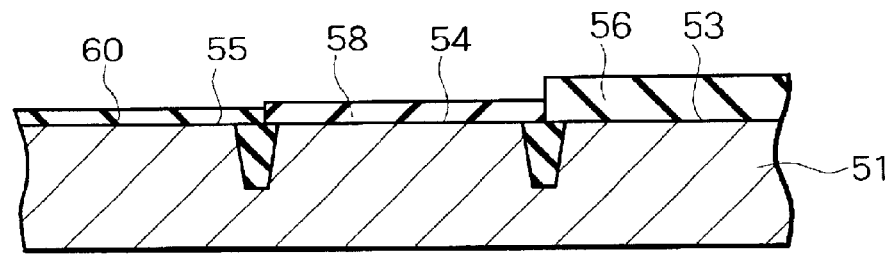

Then, a resist 59 having an opening on the region 55 is formed as shown in FIG. 8A, the silicon oxide film 56 is etched with this resist 59 as a mask, and the silicon oxide film 56 (see FIG. 7D) is removed on the region 55. Then, the resist 59 is removed as shown in FIG. 8B, and heat treatment is applied in an $O_2$ atmosphere at a pressure of 1.3 to 6.7 kPa and at a temperature of 500 to 700° C. for 10 to 20 seconds. Consequently, a silicon oxide film 60 with a film thickness of 1 to 2 nm is formed.

Figure 8C:
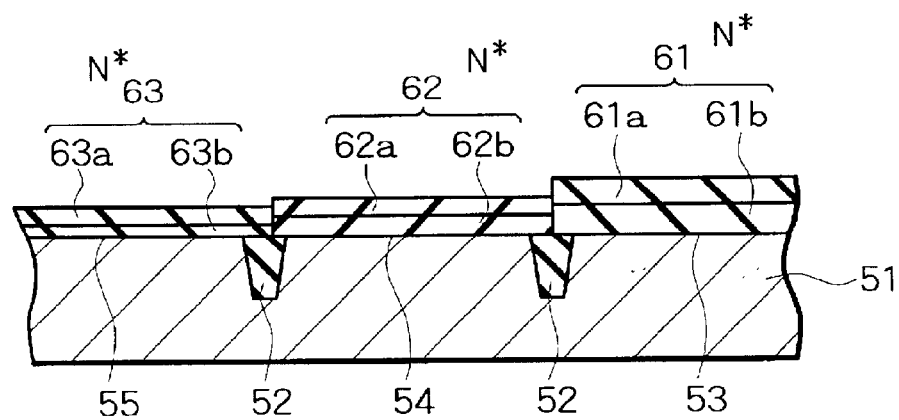

Then, radical nitriding is applied to the silicon oxide films 56, 58, and 60 (see FIG. 8B) as shown in FIG. 8C. N* indicates nitrogen radical in FIG. 8C. As the conditions for forming the nitrogen radical, atmospheric gas is mixed gas produced by mixing He and $N_2$ at a ratio of 1:1, the temperature is 500 to 600° C., and the pressure is 370 to 400 Pa. Microwave with the output of 3000 W is impressed on this mixed gas. Consequently, the nitrogen radical is formed, and the silicon oxide films 56, 58, and 60 are radical-nitrided. The time for the radical nitriding is 80 to 150 seconds. Consequently, the silicon oxide films 56, 58, and 60 are nitrided from the surface side, and are respectively changed into silicon oxynitride films 61, 62, and 63. Thus, the silicon oxynitride films 61 to 63 respectively comprise radical nitrided layers 61a to 63a that are formed at an upper layer, and non-radical nitrided layers 61b to 63b that are formed at a lower layer.

As a result, the silicon oxynitride film 61 with a film thickness of 5 to 7 nm, and a nitrogen concentration of 4 to 8 atom % is formed on the region 53 of the silicon substrate 51. The silicon oxynitride film 62 with a film thickness of 2 to 3 nm, and a nitrogen concentration of 6 to 10 atom % is formed on the region 54 of the silicon substrate 51. The silicon oxynitride film 63 with a film thickness of 1 to 2 nm, and a nitrogen concentration of 8 to 12 atom % is formed on the region 55 of the silicon substrate 51. The silicon oxynitride films 61 to 63 function as a gate dielectric film of a transistor. After this step, gate poly is grown on the silicon oxynitride films 61 and 63, and gate electrodes are formed.

When the radical nitriding is applied to the silicon oxide films 56, 58, and 60 (see FIG. 8B), the nitriding is conducted such that the non-radical nitrided layer 63b remains in the thinnest silicon oxynitride film 63 in the present embodiment. The processing time until the nitrogen reaches the interface between the silicon oxide film and the silicon substrate gets shorter as the film thickness of the silicon oxide film gets thinner. Therefore, when the non-radical nitrided layer 63b remains in the thinnest silicon oxynitride film 63, the non-radical nitrided layers also remain in the silicon oxynitride films 61 and 62 which have the thicker film thickness than the silicon oxynitride film 63. As a result, such a problem as a nitride film is formed at the interface between the silicon oxide film and the silicon substrate does not occur. On the other hand, since the radical nitriding introduces nitrogen into the radical nitrided layers 61a and 62a in the silicon oxynitride films 61 and 62, the dielectric constant increases, and the speed of the transistors can be increased.

Since the nitrogen is sufficiently introduced into the thinnest dielectric film (the silicon oxynitride film 63) in the present embodiment, it is possible to solve such a problem as impurity elements in the gate electrode diffuse in a channel region of a transistor as a result of annealing after the source and the drain are formed. The following details this effect. A MOS transistor is generally formed as described below. A gate electrode having a predetermined shape is formed using polycrystalline silicon or the like after a gate dielectric film of the transistor is formed. After this step, boron (B) or arsenic (As) as impurity for forming source and drain regions is ion-implanted into active regions of a semiconductor substrate with this gate electrode as a mask. In this step, the impurity is also implanted into the gate electrode. After this step, heat treatment (annealing) is applied to activate the impurity ion-implanted in the source and drain regions. The impurity, which is ion-implanted into the gate electrode, diffuses through the gate dielectric film, and reaches the channel region of the transistor in the semiconductor substrate in this annealing. This diffusion of the impurity becomes more remarkable as the gate dielectric film becomes thinner. If the impurity in the gate electrode reaches the channel region, the impurity causes a leak current and a fluctuation of the threshold voltage of the transistor, and characteristics of the transistor fluctuate. However, since the gate dielectric film contains nitrogen in the present embodiment, the diffusion of the impurity is restrained during the annealing, and the fluctuation of the characteristics of the transistor is restrained. As the film thickness of the gate dielectric film becomes higher, the nitrogen concentration decreases in the present embodiment. However, the decrease of the nitrogen concentration does not cause a problem, because the diffusion of the impurity is restrained more as the film thickness of the gate dielectric film increases.

While the first to third embodiments are examples of using a silicon oxynitride film as the gate dielectric film, the gate dielectric film is not limited to the silicon oxynitride film in the present invention, and may be formed using different dielectric materials such as hafnium and alumina. The phenomenon that applying radical nitriding to a dielectric film increases the dielectric constant of this dielectric film is not limited to the silicon oxide film and the silicon oxynitride film. This phenomenon is also observed in several so-called high dielectric constant materials. Especially hafnium presents a higher dielectric constant when it is nitrided.

What is claimed is:

1. A semiconductor substrate; and a plurality of types of transistors provided with gate dielectric films different in film thickness and nitrogen concentration from one another, wherein the gate dielectric film having a higher film thickness has a higher nitrogen concentration so that nitrogen concentration in said gage dielectric films monotonically and continuously decreases towards an interface of said semiconductor substrate.

2. The semiconductor device according to claim 1, wherein said gets dielectric films are formed of a plurality of types of radically nitrided dielectric films different in film thickness and nitrogen concentration from one another.

3. The semiconductor device according to claim 1, wherein said gate dielectric films consist of silicon oxynitride, hafnium nitride, or alumina nitride.

* * * * *